(12) United States Patent
Kato

(10) Patent No.: US 11,794,466 B2
(45) Date of Patent: *Oct. 24, 2023

(54) PRINTING PARAMETER ACQUISITION DEVICE AND PRINTING PARAMETER ACQUISITION METHOD

(71) Applicant: FUJI CORPORATION, Chiryu (JP)

(72) Inventor: Mitsuaki Kato, Anjo (JP)

(73) Assignee: FUJI CORPORATION, Chiryu (JP)

( * ) Notice: Subject to any disclaimer, the term of this patent is extended or adjusted under 35 U.S.C. 154(b) by 99 days.

This patent is subject to a terminal disclaimer.

(21) Appl. No.: 17/601,567

(22) PCT Filed: Apr. 26, 2019

(86) PCT No.: PCT/JP2019/018113
§ 371 (c)(1),
(2) Date: Oct. 5, 2021

(87) PCT Pub. No.: WO2020/217510
PCT Pub. Date: Oct. 29, 2020

(65) Prior Publication Data
US 2022/0161544 A1    May 26, 2022

(51) Int. Cl.
*B41F 15/08* (2006.01)
*B41F 33/00* (2006.01)
*H05K 3/34* (2006.01)

(52) U.S. Cl.
CPC .......... *B41F 15/0813* (2013.01); *B41F 15/08* (2013.01); *B41F 33/00* (2013.01); *B41F 33/0009* (2013.01); *H05K 3/3485* (2020.08); *G06F 2218/12* (2023.01)

(58) Field of Classification Search
None
See application file for complete search history.

(56) References Cited

U.S. PATENT DOCUMENTS

| | | | |
|---|---|---|---|
| 2015/0050418 A1* | 2/2015 | Greer | H05K 3/1216 427/9 |
| 2015/0018321 A1 | 7/2015 | Mantani et al. | |
| 2019/0269017 A1* | 8/2019 | Lee | G06F 30/27 |

FOREIGN PATENT DOCUMENTS

| | | |
|---|---|---|
| EP | 3 530 463 A1 | 8/2019 |
| JP | 7-32717 A | 2/1995 |
| JP | 9-24665 A | 1/1997 |
| JP | 2003-323487 A | 11/2003 |

OTHER PUBLICATIONS

International Search Report dated Jun. 11, 2019 in PCT/JP2019/018113 filed on Apr. 26, 2019 (1 page).

* cited by examiner

*Primary Examiner* — Leslie J Evanisko
(74) *Attorney, Agent, or Firm* — Oblon, McClelland, Maier & Neustadt, L.L.P.

(57) ABSTRACT

A printing parameter acquisition device includes an acquisition section and an output section. The acquisition section acquires a printing condition for specifying a member to be used when solder is printed on a board. The output section outputs, from a database that stores the printing condition, a printing parameter used for controlling driving of a printer, and a reliability of the printing parameter in association with each other, the printing parameter which is associated with the printing condition corresponding to the printing condition acquired by the acquisition section and of which the reliability is a predetermined level or more.

14 Claims, 5 Drawing Sheets

Fig. 4

| No. | PRINTING CONDITION ||| PRINTING PARAMETER ||| RELIABILITY |||
|---|---|---|---|---|---|---|---|---|
| | BOARD | SOLDER | MASK | PRINTING SPEED | PRINTING PRESSURE | NUMBER OF PRODUCTIONS | NON-DEFECTIVE PRODUCT RATE | DEVIATION |
| 1 | 6A1 | 6B1 | 6C1 | 6D1 | 6E1 | 6F1 | 6G1 | 6H1 |
| 2 | 6A1 | 6B1 | 6C1 | 6D2 | 6E2 | 6F2 | 6G2 | 6H2 |
| 3 | 6A1 | 6B2 | 6C2 | 6D3 | 6E2 | 6F3 | 6G3 | 6H3 |
| 4 | 6A2 | 6B1 | 6C2 | 6D4 | 6E3 | 6F4 | 6G4 | 6H4 |
| .. | .. | .. | .. | .. | .. | .. | .. | .. |

| PRINTING CONDITION OF BOARD | COEFFICIENT OF WEIGHTING | SCORE OF EXAMPLE 1 | | SCORE OF EXAMPLE 2 | |
|---|---|---|---|---|---|
| SIZE | 5 | NON-MATCHING | 0 | MATCHING | 5 |
| THICKNESS | 5 | MATCHING | 5 | MATCHING | 5 |
| MATERIAL | 1 | MATCHING | 1 | NON-MATCHING | 0 |
| RESIST | 1 | MATCHING | 1 | NON-MATCHING | 0 |
| : | : | : | : | : | : |

PRINTING PARAMETER ACQUISITION DEVICE AND PRINTING PARAMETER ACQUISITION METHOD

TECHNICAL FIELD

The present description relates to a printing parameter acquisition device and a printing parameter acquisition method.

BACKGROUND ART

In a printing method described in Patent Literature 1, a printing pressure in accordance with a size of a printed circuit board is acquired in advance as back data. Then, the printer automatically calls an optimum printing pressure from board data based on the back data to start printing. In the printing method described in Patent Literature 1, a printing speed and a mask release speed corresponding to a type of a metal mask are acquired in advance as the back data. Then, the printer automatically calls the optimum printing speed and mask release speed from the type of the metal mask based on the back data, to start printing.

Further, in the printing method described in Patent Literature 1, the printing speed and the mask release speed in accordance with a type of cream solder (maker, viscosity, or the like) are acquired in advance as the back data. Then, the printer automatically calls the optimum printing speed and optimum mask release speed from the type of the cream solder based on the back data to start printing. Accordingly, the printing method described in Patent Literature 1 attempts to omit an adjustment of the printing pressure, the printing speed, and the mask release speed by an operator at a time of starting the production and at a time of model switching.

In a data management system described in Patent Literature 2, each electronic component assembling factory registers, in a database of a host computer, verified installed component information for which a mounting test is completed in the factory. The database provides a search engine in which an installed component information name is generalized by a specific format and which is easily used by other electronic component assembling factories. The installed component information describes shape data and dimension data of the electronic component, a pickup condition that describes a relationship between the electronic component and an electronic component assembling machine, and the like.

When a user cannot use a trial version of the installed component information downloaded from the database, the host computer reduces an evaluation rank of the installed component information. Conversely, when the user can use the trial version of the installed component information downloaded from the database, the host computer raises the evaluation rank of the installed component information. The evaluation rank is disclosed to the user of the installed component information as a measure of the reliability of the information. Accordingly, the data management system described in Patent Literature 2 provides a material for determining the validity of the information to the user of the installed component information.

PATENT LITERATURE

Patent Literature 1: JP-A-7-32717
Patent Literature 2: JP-A-2003-323487

BRIEF SUMMARY

Technical Problem

However, in the printing method described in Patent Literature 1, the back data is individually managed for each type. Accordingly, an operation of selecting and outputting the printing parameter used for controlling driving of the printer from the back data may be complicated. Patent Literature 1 does not disclose what kind of condition is indicated by an optimum condition. The data management system described in Patent Literature 2 manages the installed component information and does not manage printing parameters.

In view of such circumstances, the present description discloses a printing parameter acquisition device and a printing parameter acquisition method capable of more preferably outputting a printing parameter used for controlling driving of a printer.

Solution to Problem

The present description discloses a first printing parameter acquisition device including an acquisition section and an output section. The acquisition section acquires a printing condition for specifying a member to be used when solder is printed on a board. The output section outputs, from a database that stores the printing condition, a printing parameter used for controlling driving of a printer, and a reliability of the printing parameter in association with each other, the printing parameter which is associated with the printing condition corresponding to the printing condition acquired by the acquisition section and of which the reliability is a predetermined level or more.

In addition, the present description discloses a second printing parameter acquisition device including an acquisition section and an output section. The acquisition section acquires a printing condition for specifying a member to be used when solder is printed on a board. The output section outputs, from a database that stores the printing condition, a printing parameter used for controlling driving of a printer, and a reliability of the printing parameter in association with each other, the printing parameter which is associated with the printing condition corresponding to the printing condition acquired by the acquisition section, and the reliability of the printing parameter.

Further, the present description discloses a first printing parameter acquisition method including an acquiring step and an outputting step. The acquiring step acquires a printing condition for specifying a member to be used when solder is printed on a board. The outputting step outputs, from a database that stores the printing condition, a printing parameter used for controlling driving of a printer, and a reliability of the printing parameter in association with each other, the printing parameter which is associated with the printing condition corresponding to the printing condition acquired by the acquiring step and of which the reliability is a predetermined level or more.

In addition, the present description discloses a second printing parameter acquisition method including an acquiring step and an outputting step. The acquiring step acquires a printing condition for specifying a member to be used when solder is printed on a board. The outputting step outputs, from a database that stores the printing condition, a printing parameter used for controlling driving of a printer, and a reliability of the printing parameter in association with each other, the printing parameter which is associated with the printing condition corresponding to the printing condition acquired by the acquiring step, and the reliability of the printing parameter.

Advantageous Effects

With the first and second printing parameter acquisition devices, the output section outputs, from the database that stores the printing condition, the printing parameter, and the reliability of the printing parameter in association with each other, the printing parameter which is associated with the printing condition corresponding to the printing condition acquired by the acquisition section. Accordingly, the first and second printing parameter acquisition devices can easily manage the printing condition, the printing parameter, and the reliability of the printing parameter, and can easily output the printing parameter. In addition, the output section of the first printing parameter acquisition device outputs the printing parameter having the reliability of a predetermined level or more. The output section of the second printing parameter acquisition device outputs the printing parameter and the reliability of the printing parameter. Accordingly, the first and second printing parameter acquisition devices can more preferably output the printing parameter used for controlling the driving of the printer. The above description with respect to the printing parameter acquisition device can be similarly applied to the printing parameter acquisition method.

BRIEF DESCRIPTION OF DRAWINGS

FIG. 4 is a schematic view illustrating an example of data stored in database 60.

DESCRIPTION OF EMBODIMENTS

Figure 1:
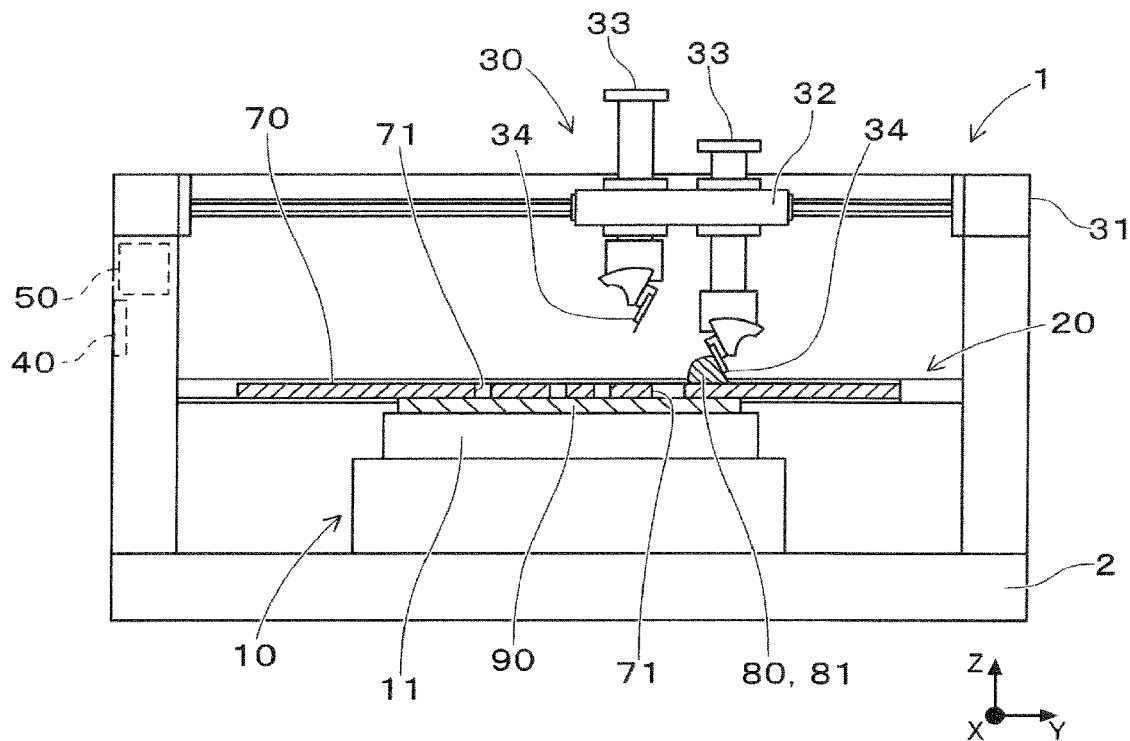
FIG. 1 is a cross-sectional view illustrating a configuration example of printer 1.

1. Embodiment 1-1. Configuration Example of Printer 1

In printer 1 according to the present embodiment, solder 80 is moved along mask 70 by squeegee 34, so that a printing process is executed on board 90. Printer 1 is included in a board working machine that performs a predetermined board work on board 90 to produce a board product. Printer 1 constitutes a board production line together with the board working machine such as a printing inspector, a component mounter, a reflow furnace, and an appearance inspector (any of which is not illustrated).

As illustrated in FIG. 1, printer 1 includes board conveyance device 10, mask supporting device 20, squeegee moving device 30, display device 40, and control device 50. As illustrated in FIG. 1, a conveyance direction (front-rear direction in FIG. 1) of board 90 is set to X-axis direction, a front-rear direction (left-right direction in FIG. 1) of printer 1 orthogonal to the X-axis is set to Y-axis direction, and a vertical direction (up-down direction in FIG. 1) orthogonal to the X-axis and the Y-axis is set to Z-axis direction.

Board conveyance device 10 conveys a board 90 of a printing target. Board 90 is a circuit board and at least one of an electronic circuit and an electrical circuit is formed. Board conveyance device 10 is provided on base 2 of printer 1.

Board conveyance device 10 conveys board 90 disposed on a pallet, for example, by a belt conveyor extending in X-axis direction. Board conveyance device 10 includes board holding section 11 that holds board 90 loaded in printer 1. Board holding section 11 holds board 90 in a state in which an upper surface of board 90 is in close contact with a lower surface of mask 70 at a predetermined position on a lower surface side of mask 70.

Mask supporting device 20 is disposed above board conveyance device 10. Mask supporting device 20 supports mask 70 by a pair of support tables (one support table is illustrated in FIG. 1). The pair of support tables are disposed on a left side and a right side of printer 1 when viewed in a front face direction, and are formed so as to extend along Y-axis direction. It should be noted that FIG. 1 is a partial cross-sectional view of printer 1 taken along Y-axis direction, and schematically illustrates an inside of printer 1 and cross-sections of mask 70 and board 90 as viewed in a side face direction. Opening section 71 extending through mask 70 at a position corresponding to a wiring pattern of board 90 is formed. Mask 70 is supported by mask supporting device 20, for example, via a frame member provided on an outer peripheral edge.

Squeegee moving device 30 lifts and lowers squeegee 34 in a direction (Z-axis direction) perpendicular to mask 70 and moves squeegee 34 in Y-axis direction on the upper surface of mask 70. Squeegee moving device 30 includes head driving device 31, squeegee head 32, a pair of lifting and lowering devices 33 and 33, and a pair of squeegees 34 and 34. Head driving device 31 is disposed at the upper portion of printer 1. Head driving device 31 can move squeegee head 32 in Y-axis direction by, for example, a linear motion mechanism such as a feeding screw mechanism.

Squeegee head 32 is clamped and fixed to a moving body constituting a linear motion mechanism of head driving device 31. Squeegee head 32 holds the pair of lifting and lowering devices 33 and 33. Each of the pair of lifting and lowering devices 33 and 33 holds squeegee 34 and can be driven independently of each other. Each of the pair of lifting and lowering devices 33 and 33 drives, for example, an actuator such as an air cylinder to lift and lower squeegee 34 to be held.

The pair of squeegees 34 and 34 slide on the upper surface of mask 70 to move solder 80 supplied to the upper surface of mask 70 along mask 70. As solder 80, a cream solder (solder paste) can be used. Solder 80 is imprinted on board 90 from opening section 71 of mask 70, so that solder 80 is printed on board 90 disposed on a lower surface side of mask 70. In the present embodiment, each of the pair of squeegees 34 and 34 is a plate-like member formed so as to extend along X-axis direction orthogonal to the printing direction (Y-axis direction).

Squeegee 34 on the front side (left side in FIG. 1) of the pair of squeegees 34 and 34 is used in the printing process for moving solder 80 from the front side to the rear side, and a direction from the front side to the rear side of printer 1 is set as the advancing direction. Rear squeegee 34 (right side in FIG. 1) of the pair of squeegees 34 and 34 is used for printing process to move solder 80 from the rear side to the front side, and the direction from the rear side to the front side of printer 1 is set as an advancing direction. In any of squeegees 34, a direction opposite to the advancing direction is set as a backward direction.

Each of the pair of squeegees 34 and 34 is held by lifting and lowering device 33 such that a front face portion positioned on an advancing side is inclined so as to face below. In other words, each of the pair of squeegees 34 and 34 is held by lifting and lowering device 33 such that a rear surface portion positioned on a retreat side is inclined so as to face above. An inclination angle of each of the pair of squeegees 34 and 34 is adjusted by an adjustment mechanism provided at a lower portion of lifting and lowering device 33.

Display device 40 can display an operation status of printer 1. Display device 40 is configured by a touch panel and also functions as an input device for receiving various operations by a user of printer 1.

Control device 50 includes a known computing device and a storage device, and a control circuit is configured (any of which is not illustrated). Control device 50 is communicably connected to a management device via a network and can transmit and receive various data. Control device 50 drives and controls board conveyance device 10, mask supporting device 20, squeegee moving device 30, and display device 40 based on a production program, detection results detected by various sensors, or the like.

Figure 2:
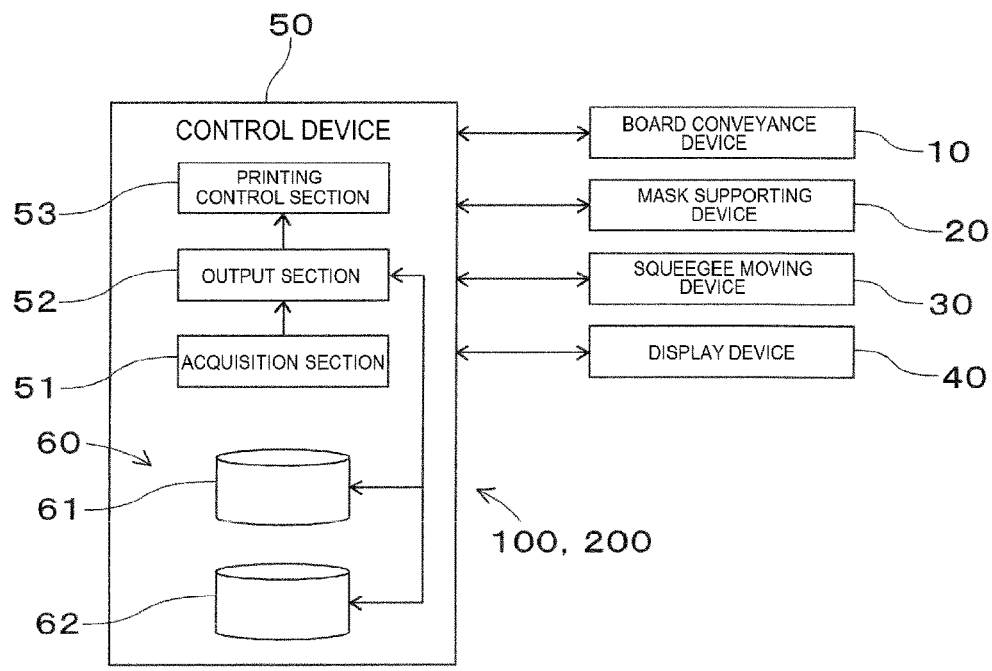
FIG. 2 is a block diagram illustrating an example of control blocks of first printing parameter acquisition device 100 and second printing parameter acquisition device 200.

As illustrated in FIG. 2, when viewed as a control block, control device 50 includes acquisition section 51, output section 52, and printing control section 53. In addition, control device 50 is provided with database 60. The descriptions of acquisition section 51, output section 52, and database 60 will be described later.

Printing control section 53 drives and controls, for example, squeegee moving device 30. In this case, printing control section 53 acquires various information stored in the storage device and detection results of various sensors provided in printer 1. As the storage device, for example, a magnetic storage device such as a hard disk device, a storage device using a semiconductor element such as a flash memory, or the like can be used. The storage device stores a production program or the like for driving printer 1.

Printing control section 53 transmits a control signal to squeegee moving device 30 based on the various types of information and the detection result described above. Therefore, a position in Y-axis direction and a position (height) in Z-axis direction of the pair of squeegees 34 and 34 held by squeegee head 32, as well as the movement speed and the inclination angle are controlled.

1-2. One Example of Printing Process

When board 90 is loaded by board conveyance device 10 and board 90 is disposed at a predetermined position on the lower surface side of mask 70, a printing process is executed. When the printing process is started, solder 80 is supplied to the upper surface of mask 70. As illustrated in FIG. 1, in solder 80, solder roll 81 is formed by a kneading process.

Solder roll 81 is formed by kneading a paste-like cream solder by a pair of squeegees 34 and 34. Solder roll 81 is solder 80 in a state in which solder roll 81 extends in a longitudinal direction (X-axis direction) of squeegee 34 and the width in the printing direction (Y-axis direction) is substantially uniform. In the following description, solder roll 81 is appropriately described as solder 80.

Printing control section 53 first executes a preparation step. One squeegee 34 of the pair of squeegees 34 and 34 is referred to as a first squeegee. The other squeegee 34 of the pair of squeegees 34 and 34 is referred to as a second squeegee. In the preparation step, the first squeegee is positioned at a predetermined position (height) retracted above mask 70. Further, the first squeegee is positioned at a predetermined position on a retreat side of the Y-axis direction position of solder roll 81.

Next, printing control section 53 executes a squeegee lowering step to lower the first squeegee to a printing position (height) at which a lower end portion of the first squeegee comes into contact with mask 70. Therefore, the first squeegee is in a contact state with mask 70 with a predetermined pressure. Subsequently, printing control section 53 drives and controls head driving device 31 to execute a printing step.

In the printing step, printing control section 53 moves the first squeegee in an advancing direction in a state of maintaining the printing position (height). Solder roll 81 supplied to the upper surface of mask 70 is moved along mask 70 in accordance with the movement of the first squeegee. At this time, solder roll 81 is imprinted on board 90 from opening section 71 of mask 70, so that solder 80 is printed on the upper surface of board 90 disposed on the lower surface side of mask 70.

After the first squeegee passes through a predetermined printing range, printing control section 53 drives and controls lifting and lowering device 33 to execute a squeegee lifting step. In the squeegee lifting step, the first squeegee is separated from solder roll 81. At this time, printing control section 53 lifts the first squeegee at a predetermined movement speed along a predetermined movement trajectory. The above-mentioned movement trajectory and the movement speed are set, for example, based on physical properties of solder roll 81 in use, or the like. Next, printing control section 53 switches from the first squeegee to the second squeegee, and repeats the above-described printing process so that squeegee head 32 reciprocates in Y-axis direction.

1-3. Configuration Example of First Printing Parameter Acquisition Device 100

For example, when the size, the thickness, and the like of board 90 are different from each other, the deflection amount of board 90 when board holding section 11 holds board 90 may change. Therefore, in order to improve the printing accuracy of solder 80, it is necessary to change printing parameters (in this case, for example, a printing pressure, a mask release speed, a mask release distance, and the like) used for controlling the driving of printer 1 in accordance with the size, the thickness, and the like of board 90. In the present description, an index for specifying a member (in this case, the board) to be used when solder 80 is printed on board 90 is referred to as a printing condition.

As described above, when the members used when solder 80 is printed on board 90 are different from each other, it is necessary to change the printing parameters. However, the larger the number of members, the more complicated the setting work of the printing parameter is. In order to derive an appropriate printing parameter from the printing condition, there are many cases that an experience and a print performance of an engineer specializing in printing are necessary.

Specifically, an engineer specializing in printing calculates a temporary printing parameter from his/her experience so far and repeats test printing using a temporary printing parameter to derive an appropriate printing parameter. Therefore, advice from an engineer, an evaluation department, a sales department, or the like on the manufacturer side of printer 1 is necessary, so that it is difficult for the user of printer 1 to derive appropriate printing parameters from the printing conditions.

Therefore, printer 1 of the present embodiment includes first printing parameter acquisition device 100. As illustrated in FIG. 2, first printing parameter acquisition device 100 includes acquisition section 51 and output section 52. Acquisition section 51 acquires printing conditions for specifying a member to be used when solder 80 is printed on board 90. Output section 52 outputs, from database 60, a printing parameter that is associated with the printing condition corresponding to the printing condition acquired by acquisition section 51 and has a reliability having a predetermined level or more.

Figure 3:
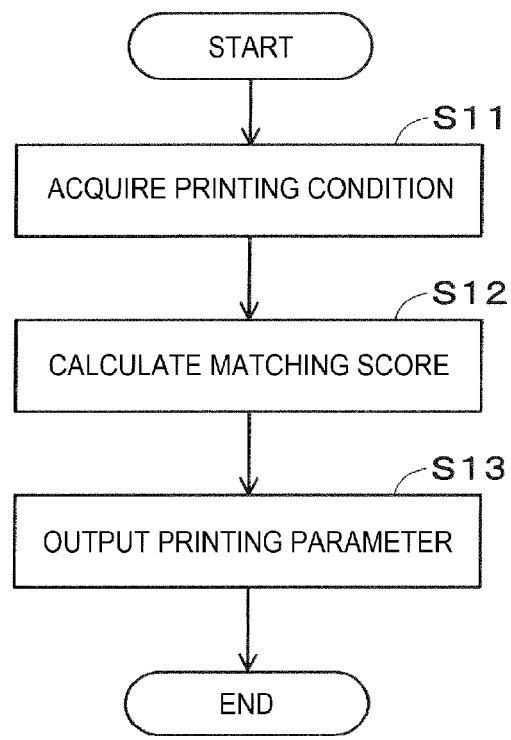
FIG. 3 is a flowchart illustrating an example of a control procedure by first printing parameter acquisition device 100 and second printing parameter acquisition device 200.

First printing parameter acquisition device 100 executes control according to the flowchart illustrated in FIG. 3. Acquisition section 51 performs the process illustrated in step S11. Output section 52 performs the processes illustrated in steps S12 and S13. When the printing parameter is determined and the production program is determined, printing control section 53 executes the printing process. When the printing process is completed, first printing parameter acquisition device 100 updates the reliability of the printing parameter and stores necessary data in database 60.

1-3-1. Configuration Example of Database 60

Database 60 stores the printing condition, the printing parameter used to control the driving of printer 1, and the reliability of the printing parameter in association with each other. The printing condition is not limited as long as a member used when solder 80 is printed on board 90 can be specified. The printing condition of the present embodiment preferably specifies at least one of board 90, solder 80, mask 70, and squeegee 34, which are members used when solder 80 is printed on board 90.

For example, a size, a thickness, and a material (including, for example, flexibility, or the like) of board 90, and a thickness of the resist (insulating layer), as well as the use (for example, general consumer device, in-vehicle device, or the like) of the board product are included in the printing condition for specifying board 90. In addition, for example, a manufacturing maker, a type, a particle diameter, a viscosity, and a thixotropic rate of solder 80 are included in the printing condition for specifying solder 80.

Further, for example, a shape (for example, circular, square, rectangular, or the like) of opening section of mask 70, a size of opening section, a thickness of mask 70, a frame size, presence or absence of half etching, and a size of the component to be mounted on board 90 after printing are included in the printing condition for specifying mask 70. For example, a material (for example, metal squeegee, urethane squeegee, or the like), and a thickness of squeegee 34 are included in the printing condition for specifying squeegee 34.

The printing parameter may be any parameter as long as it is used to control the driving of printer 1, and is not limited. The printing parameter of the present embodiment is preferably a control parameter for controlling at least one of a printing speed, a printing pressure, a mask release speed, a mask release distance, a cleaning interval and a cleaning method of mask 70, and an angle of squeegee 34 at the time of printing.

The printing speed is referred to as a movement speed when squeegee 34 moves in the advancing direction in the printing step. The printing pressure is referred to as a pressure applied by squeegee 34 to mask 70 in the printing step. The mask release speed and the mask release distance refer to a speed and a distance (height) when mask 70 is separated from board 90 after the printing step. The cleaning interval and the cleaning method refer to an interval and a method for cleaning mask 70.

For example, the cleaning method includes a dry method, a wet method (for example, a method of coating alcohol or the like for cleaning), and a suction method (a method of suction and cleaning a residue remaining on mask 70). The angle of squeegee 34 is referred to as an angle of squeegee 34 with respect to mask 70 when squeegee 34 moves in the advancing direction in the printing step.

The reliability of the printing parameter can be represented by, for example, the matching score, the number of productions of the board products produced by using the printing parameter, a throughput, a non-defective product rate, a deviation of each of the area, the height, and the volume of solder 80 printed on board 90, with respect to a target value, or the like. The matching score is a score obtained by multiplying the matching degree between the printing condition acquired by acquisition section 51 and the printing condition stored in database 60 by a coefficient indicating weighting for each printing condition.

The throughput is referred to as a processing capacity per unit time from an initiation of loading of board 90 by printer 1 to the printing of solder 80 on board 90 to allow unloading of board 90 from printer 1. The non-defective product rate is a ratio of non-defective products when multiple board products are produced by using printing parameters. The reliability of the printing parameter is described in detail in the description of output section 52.

FIG. 4 schematically illustrates a state in which the printing condition, the printing parameter, and the reliability of the printing parameter are stored in database 60 in association with each other. No. 1 indicates that the printing condition for specifying board 90 indicated by data 6A1, the printing condition for specifying solder 80 indicated by data 6B1, and the printing condition for specifying mask 70 indicated by data 6C1 are stored in database 60 in association with each other. No. 1 indicates that the printing parameter for controlling the printing speed indicated by data 6D1 and the printing parameter for controlling the printing pressure indicated by data 6E1 are stored in database 60 in association with each other.

In addition, No. 1 indicates that the reliability of the printing parameter represented by the number of productions of the board products indicated by data 6F1, the reliability of the printing parameter represented by the non-defective product rate indicated by data 6G1, and the reliability of the printing parameter represented by the deviation indicated by data 6H1 are associated with each other and stored in database 60. No. 1 indicates that the printing condition, the printing parameter, and the reliability of the printing parameter are stored in database 60 in association with each other.

For convenience of illustration, some of the printing conditions, the printing parameters, and the reliability of the printing parameters are schematically illustrated in the drawing. For example, the printing condition for specifying board 90 is stored for each of the above-described multiple indices (for example, the size, the thickness, and the material of board 90, and the thickness of the resist, as well as the use of the board product, or the like). The above description can be similarly applied to other printing conditions. Database 60 can also store the other printing conditions, the printing parameters, and the reliability of the printing parameter described above. In addition, the above description can be similarly applied to No. 2 and subsequent data.

As illustrated in FIG. 2, database 60 preferably includes first database 61 and second database 62. First database 61 is provided by a manufacturer of printer 1. First database 61 mainly stores data to be used at an initial stage of the introduction of printer 1. As described above, in order to derive an appropriate printing parameter from the printing condition, there are many cases that experience and print performance of an engineer specializing in printing are necessary. Therefore, first database 61 may store data (printing conditions, printing parameters, and reliability of the printing parameters) created based on the experience and the print performance of the engineer specializing in printing on the side of the manufacturer of printer 1.

Second database 62 stores the printing conditions, the printing parameters, and the reliability of the printing parameters used when the user of printer 1 produces the board product by using printer 1 in association with each other. That is, second database 62 stores data associated with the board product produced by the user of printer 1. Therefore, the more the user of printer 1 produces the board product, the more the data is accumulated, so that the printing parameter matching the board product produced by the user of printer 1 can be easily obtained. In addition, by causing the engineer on a user side of printer 1 to adjust the printing parameter based on the production result of the board product, it is possible to expect that the reliability of the printing parameter is improved.

In addition, when at least a part of the printing parameters included in the production program for driving printer 1 is changed, second database 62 preferably stores the printing condition, the changed printing parameter, and the reliability of the changed printing parameter in new association with each other. Therefore, second database 62 can store the printing condition, the changed printing parameter, and the reliability of the changed printing parameter when at least a part of the printing parameters included in the production program is changed in appropriate association with each other.

For example, the data of No. 1 illustrated in FIG. 4, it is assumed that the printing parameter for controlling the printing speed indicated by data 6D1 is changed. In this case, second database 62 does not update the data of No. 1, secures a storage region separately from the data of No. 1, and stores the printing condition, the changed printing parameter, and the reliability of the changed printing parameter in association with each other. First database 61 and second database 62 may be constructed to have the same data structure. In addition, database 60 may be normalized. Therefore, the printing parameter is easily searched for, so that the searching time of the printing parameter can be easily shortened.

1-3-2. Acquisition Section 51

Figure 5A:
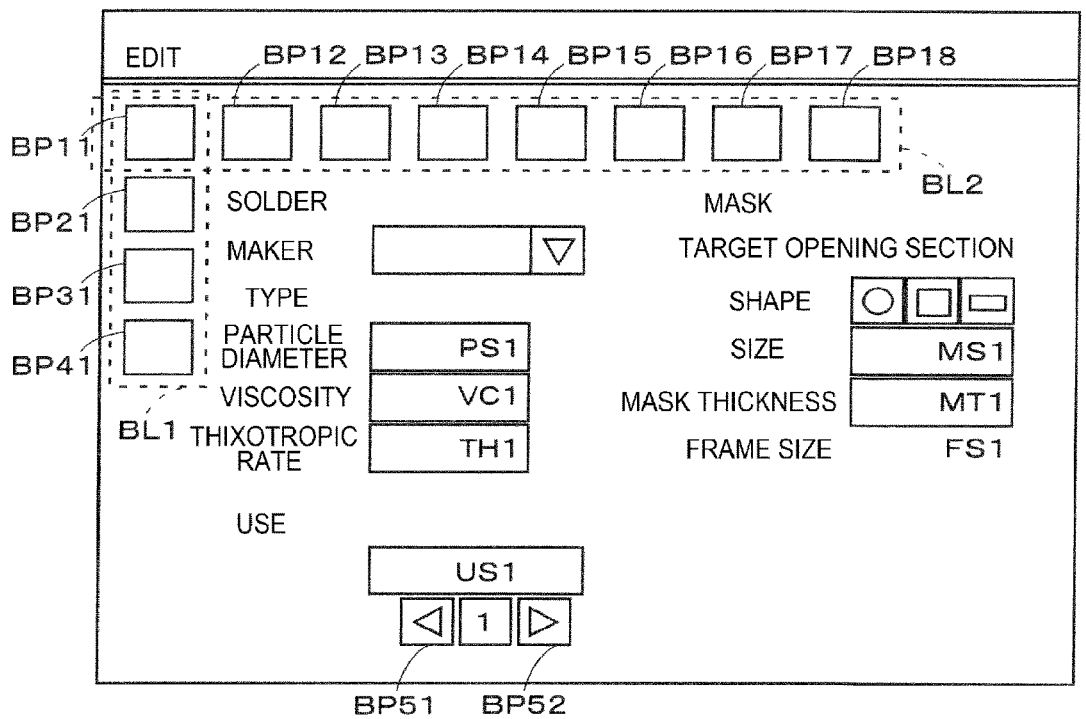
FIG. 5A is a schematic view illustrating an example of an input screen.

Acquisition section 51 acquires a printing condition for specifying a member to be used when solder 80 is printed on board 90 (step S11 illustrated in FIG. 3). Acquisition section 51 can acquire the printing condition, for example, using an input screen illustrated in FIG. 5A. The input screen is displayed, for example, on display device 40 illustrated in FIGS. 1 and 2.

The user of printer 1 can cause display device 40 to display an operation phase by operating operation sections BP11, BP21, BP31, and BP41 surrounded by dashed line BL1. When the user operates operation section BP11, display device 40 displays an operation in a creation stage of a production program. When the user operates operation section BP21, display device 40 displays an operation in a production stage. When the user operates operation section BP31, display device 40 displays an operation in a clearing stage. When the user operates operation section BP41, display device 40 displays an operation in an error generation stage.

In addition, after selecting the operation phase, the user of printer 1 can select or input the operation in each operation phase by sequentially operating the operation sections surrounded by dashed line BL2 (in this drawing, operation sections BP12 to BP18 are illustrated). Display device 40 can also display an operation status in each operation phase. First, when the user operates operation section BP12, selection or input of the printing conditions for specifying board 90 described above is enabled.

Next, when the user operates operation section BP13, it is possible to select or input a coordinate, a shape, or the like of a positioning reference section (not illustrated) provided on board 90. Subsequently, when the user operates operation section BP14, it is possible to select or input the printing condition for specifying the above-described solder 80, the printing condition for specifying mask 70, and the like. This drawing illustrates a state in which particle diameter PS1, viscosity VC1, and thixotropic rate TH1 of solder 80 are inputted.

In addition, this drawing illustrates a state in which the shape (for example, circular) of the target opening section of mask 70 is selected, and size MS1 of the target opening section, thickness MT1 of mask 70, and frame size FS1 are inputted. Further, this drawing illustrates a state in which use US1 of the board product is inputted. The target opening section of mask 70 means an opening section having a minimum size among multiple opening sections provided in mask 70. In addition, the input screen may be capable of inputting size MS1 of the target opening section of mask 70, as well as the size of the smallest component among multiple components to be mounted on board 90 after printing. Instead of size MS1 of the target opening section of mask 70, the input screen may be capable of inputting the size of the smallest component among multiple components to be mounted on board 90 after printing.

Further, for example, the user may automatically input the particle diameter, the viscosity, the thixotropic rate, and the like of solder 80 stored in advance by selecting or inputting the maker, the type, and the like of solder 80. The above description can be similarly applied to the input of other printing conditions. Next, when the user operates operation section BP15, it is possible to perform setting related to the cleaning of mask 70. Subsequently, when the user operates operation section BP16, it is possible to perform a changeover operation. Next, when the user operates operation section BP17, it is possible to perform the clamping confirmation operation. Subsequently, when the user operates operation section BP18, it is possible to perform test printing.

1-3-3. Output Section 52

Output section 52 outputs, from database 60, a printing parameter associated with the printing condition corresponding to the printing condition acquired by acquisition section 51 and having a reliability of a predetermined level or more (step S12 and step S13 illustrated in FIG. 3). For example, output section 52 can output the printing parameter using the output screen illustrated in FIG. 5B. Similarly to the input screen, the output screen is displayed, for example, on display device 40 illustrated in FIG. 1 and FIG. 2.

Output section 52 preferably scores the degree of matching between the printing condition acquired by acquisition section 51 and the printing condition stored in database 60 by multiplying the matching degree by a coefficient indicating weighting for each printing condition. Then, output section 52 preferably determines that the higher the matching score indicating the matching degree, the more the printing condition acquired by acquisition section 51 corresponds to the printing condition stored in database 60.

For example, the larger the size of board 90 and the thinner the thickness of board 90, the more a deflection amount of board 90 is easily increased. In the printing process, in a case in which the deflection amount of board 90 is emphasized, for example, the coefficient indicating the weighting of the printing condition for specifying the size and the thickness of board 90 may be increased as compared with other printing conditions.

Figures 6, 7:
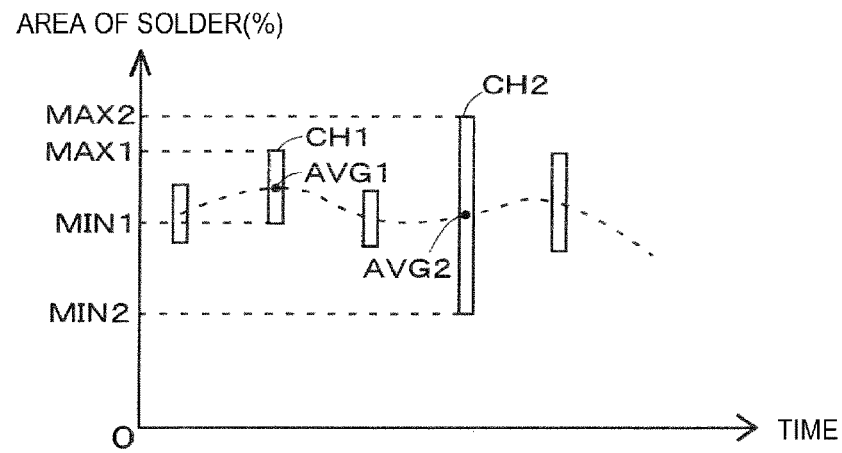
FIG. 6 is a schematic view illustrating an example of a method of calculating the matching score.
FIG. 7 is a view illustrating an example of a display method for displaying a deviation of an area of solder 80 printed on board 90.

FIG. 6 illustrates an example of a method of calculating the matching score at this time. The coefficients of the size and the thickness of board 90 are set to 5 (5 times when matched), and the other coefficients are set to 1 (1 times when matched). The printing condition of Example 1 stored in database 60 has a larger number of matching printing conditions than the printing conditions of Example 2. However, a total score (matching score) in Example 1 multiplied by the above coefficient is 7 points, which is smaller than a total score (10 points) in Example 2. Accordingly, in the above weighting, it is determined that the printing condition of the example 2 stored in database 60 corresponds to the printing condition acquired by acquisition section 51, as compared with the printing condition of the example 1.

As described above, the correspondence degree of the printing condition changes depending on the magnitude of the coefficient indicating the weighting. Accordingly, the coefficient indicating the weighting of the printing condition may be determined, for example, based on the experience and the printing performance of the engineer specializing in printing on the side of the manufacturer of printer 1. The engineer determines the coefficient in consideration of the influence degree described above. The coefficient indicating the weighting of the printing condition may be a fixed value and, for example, may be a variable value that can be changed for each type of board product.

In addition, acquisition section 51 may receive a change of a coefficient by the user of printer 1. Acquisition section 51 can receive the change of the coefficient by the user of printer 1, for example, using the input screen illustrated in FIG. 5A. In this case, for example, the engineer on the user side of printer 1 can adjust the coefficient indicating the weighting of the printing condition based on the printing performance. Therefore, the above-mentioned coefficient preferable for the board product produced by the user of printer 1 can be easily set.

As the matching score is higher, the printing condition acquired by acquisition section 51 corresponds to the printing condition stored in database 60.

Accordingly, it can be said that the printing parameter associated with the printing condition (printing condition having a high correspondence degree) having a high matching score makes it easier to reproduce the production status of the board product in the past, and the reliability of using the printing parameter is high. That is, the reliability of the printing parameter can be indicated by the matching score. In this case, output section 52 outputs a printing parameter (corresponding to a printing parameter of which the reliability is a predetermined level or more) of which the matching score is a predetermined score or more. In addition, output section 52 preferably outputs the printing parameters in descending order of the matching score.

For example, it is assumed that acquisition section 51 acquires the printing condition for specifying board 90 indicated by data 6A1 in FIG. 4, the printing condition for specifying solder 80 indicated by data 6B2, and the printing condition for specifying mask 70 indicated by data 6C2. In this case, output section 52 outputs the printing parameter (printing parameter for controlling the printing speed indicated by data 6D3 and printing parameter for controlling the printing pressure indicated by data 6E2) having the highest matching score.

Figure 5B:
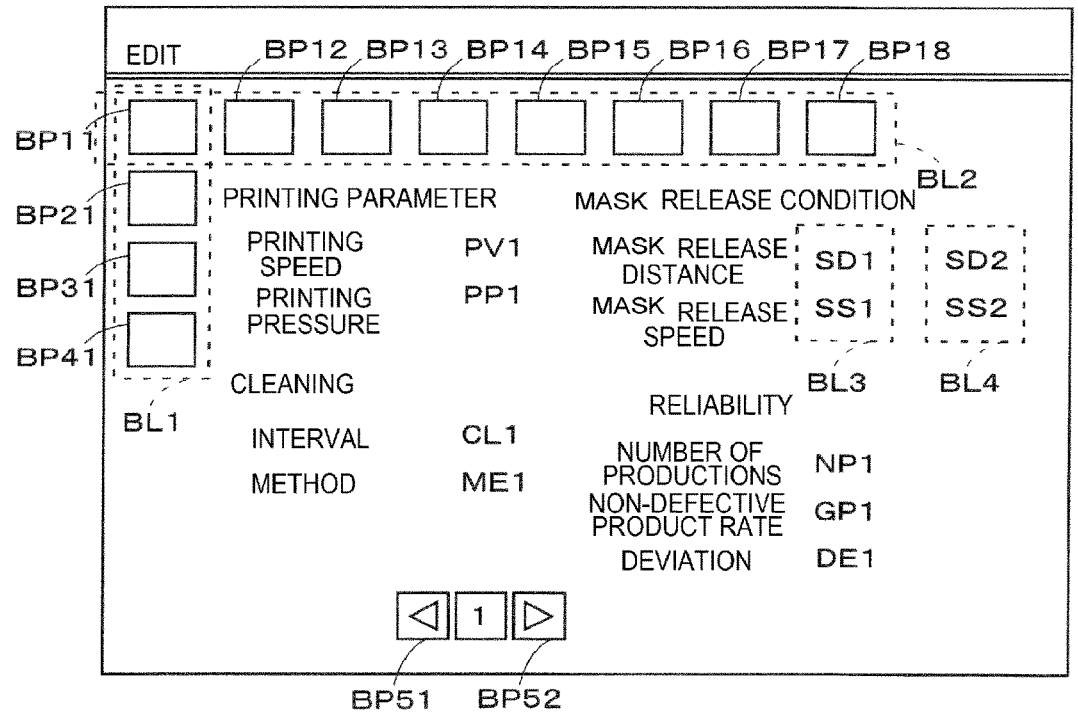
FIG. 5B is a schematic view illustrating an example of an output screen.

FIG. 5B illustrates an example of the output of the printing parameter. In this drawing, a state is illustrated in which printing speed PV1, printing pressure PP1, mask release speeds SS1 and SS2, mask release distances SD1 and SD2, cleaning interval CL1, and cleaning method ME1 of mask 70 are output from among the printing parameters having the highest matching score. Printing speed PV1 illustrated in FIG. 5B corresponds to the printing parameter for controlling the printing speed indicated by data 6D3 in FIG. 4. Printing pressure PP1 illustrated in FIG. 5B corresponds to the printing parameter for controlling the printing pressure illustrated in data 6E2 in FIG. 4. In FIG. 4, descriptions of other printing parameters such as the mask release speed are omitted. The mask release speed and the mask release distance are set, for example, in two steps. First mask release distance SD1 and mask release speed SS1 are output in a region surrounded by dashed line BL3. Second mask release distance SD2 and mask release speed SS2 are output in a region surrounded by dashed line BL4.

Although cleaning interval CL1 and cleaning method ME1 of mask 70 are schematically illustrated in this drawing, they can be visually displayed by an icon or the like. In addition, output section 52 can also output the angle of squeegee 34 at the time of printing. When the user operates operation section BP51, the printing parameter having the second highest number of the matching score is output. Each time the user operates operation section BP51, a printing parameter having a lower matching score than that of the displayed printing parameter is output.

Conversely, each time the user operates operation section BP52, a printing parameter having a higher matching score than that of the displayed printing parameter is output. In addition, output section 52 can also display a list of printing parameters. The above description can be similarly applied to a case in which output section 52 outputs the printing parameter based on the reliability of the printing parameter described below.

It can be said that the larger the number of productions of the board products produced by using the printing parameter, the higher the production record by using the printing parameter is. Accordingly, it can be said that the higher the number of productions of the board products of the printing parameter, the higher the reliability of using the printing parameter is. That is, the reliability of the printing parameter can be represented by the number of productions of the board products produced by using the printing parameter. In this case, output section 52 outputs a printing parameter (corresponding to a printing parameter of which the reliability is a predetermined level or more) in which the number of productions of the board products is a predetermined number or more. Output section 52 preferably outputs the printing parameters in descending order of the number of productions.

Here, the processing capacity per unit time from the time when printer 1 starts the loading of board 90 to the time when solder 80 is printed on board 90 to allow unloading of board 90 from printer 1 is referred to as the throughput. The throughput can be acquired based on simulation, an actual performance when the board product is actually manufactured, and the like. The higher the throughput, the easier the production time of the board product is shortened. For example, as the printing parameter for which the printing speed is set to be high, the throughput is easily increased, so that the production time of the board product is likely to be shortened.

Accordingly, in a case in which it is desired to preferentially output the printing parameter for the production time of the board product, it can be said that the higher the throughput of the printing parameter, the higher the reliability of using the printing parameter is. That is, the reliability of the printing parameter can be represented by the throughput. In this case, output section 52 outputs a printing parameter (corresponding to a printing parameter of which the reliability is a predetermined level or more) of which the throughput is a predetermined level or more. It is preferable that output section 52 output the printing parameters in descending order of the throughput.

The ratio of non-defective products when multiple board products are produced by using the printing parameter is referred to as a non-defective product rate. The good or bad quality of the board product can be determined by a printing inspector. The printing inspector sets a reference range for determining that each of the area, the height, and the volume of solder 80 printed on board 90 is the non-defective product. Then, the printing inspector determines that board 90 is the non-defective product when all of the area, the height, and the volume of solder 80 fall within the reference range at all of multiple printing positions of board 90. Conversely, the printing inspector determines that board 90 is a defective product when at least one of the area, the height, and the volume of solder 80 at at least one printing position of board 90 deviates from the reference range.

It can be said that the higher the non-defective product rate (closer to 100%) of the printing parameter, the higher the reliability of using the printing parameter is. That is, the reliability of the printing parameter can be represented by the non-defective product rate. In this case, output section 52 outputs a printing parameter (corresponding to a printing parameter of which the reliability is a predetermined level or more) having a non-defective product rate of a predetermined ratio or more. Output section 52 preferably outputs the printing parameters in descending order of the non-defective product rate.

Even if all of the area, the height, and the volume of solder 80 fall within the reference range, as the variation in multiple printing positions of board 90 increases, the print quality is likely to deteriorate. For example, the smaller the area of printed solder 80 with respect to the target value (area of the region where solder 80 is to be printed), the easier solder 80 is chipped. Conversely, the larger the area of printed solder 80 with respect to the target value, the easier solder 80 bleeds. In addition, the lower the height of printed solder 80 with respect to the target value, the easier solder 80 is faintly printed. Conversely, the higher the height of printed solder 80 with respect to the target value, the easier printed solder 80 has a horned shape.

That is, the reliability of the printing parameter can be represented by the deviation with respect to the target value for each of the area, the height, and the volume of solder 80 printed on board 90. In this case, output section 52 outputs a printing parameter (corresponding to a printing parameter of which the reliability is a predetermined level or more) of which the deviation is a predetermined value or less. It is preferable that output section 52 output the printing parameters in ascending order of the deviation.

FIG. 7 illustrates an example of a display method for displaying the deviation of the area of solder 80 printed on board 90. A horizontal axis in this drawing represents time, and a vertical axis represents the area (ratio to the target value) of solder 80. Chart CH1 illustrates an example of the deviation of the area of solder 80 printed on one board 90 with respect to the target value. Chart CH2 illustrates an example of the deviation of the area of solder 80 printed on another board 90 with respect to the target value.

Maximum value MAX1 is referred to as a maximum value of the ratio of the area of solder 80 printed at each of multiple printing positions of one board 90 with respect to the target value. Minimum value MIN1 is referred to as a minimum value of the ratio of the area of solder 80 printed at each of multiple printing positions of one board 90 with respect to the target value. Average value AVG1 is referred to as an average value of the ratio of the area of solder 80 printed at each of multiple printing positions of one board 90 with respect to the target value. As for maximum value MAX2, minimum value MIN2, and average value AVG2, the same can be said by replacing one board 90 with another board 90.

In the example illustrated in this drawing, a deviation obtained by subtracting minimum value MIN2 from maximum value MAX2 of chart CH2 is larger than a deviation obtained by subtracting minimum value MIN1 from maximum value MAX1 of chart CH1. Accordingly, the printing quality of other one board 90 illustrated in chart CH2 may be deteriorated as compared with one board 90 illustrated in chart CH1. As described above, when the deviation of the area of solder 80 printed on board 90 is displayed, the user of printer 1 can easily determine the superiority or inferiority of the printing quality. The above description can be similarly applied to the height and the volume of solder 80.

The reliability of the printing parameter can be represented by multiple indices described above. That is, the reliability of the printing parameter can be represented by at least one of the matching score, the number of productions of the board products produced by using the printing parameter, the throughput, the non-defective product rate, and the deviation with respect to the target value for each of the area, the height, and the volume of solder 80 printed on board 90. In addition, output section 52 can output the printing parameters in the order from a printing parameter having good multiple indices. For example, output section 52 can output the printing parameters in the order from a printing parameter having the highest matching score and the highest number of productions of the board products. The above description can be similarly applied to other combinations of multiple indices.

In addition, output section 52 can output the printing parameters in the order of higher reliability (higher matching score) with respect to a predetermined index (for example, matching score) representing the reliability of the printing parameter, and then sort the printing parameters in the order of higher reliability (higher the number of productions) with respect to other indices (for example, the number of productions of board products). Switching of the output of the printing parameter is executed, for example, by a user of printer 1 operating a predetermined operation section of the output screen. In addition, it is also possible to set the priority for multiple indices representing the reliability of the printing parameter. In this case, the printing parameters are sorted in descending order of the reliability from the index having the highest priority.

As described above, when the printing parameter is determined and the production program is determined, printing control section 53 executes the printing process. When the printing process is completed, first printing parameter acquisition device 100 updates the reliability of the printing parameter and stores necessary data in database 60. Specifically, first printing parameter acquisition device 100 receives, for example, the reliability (for example, the non-defective product rate) of the printing parameter from printing inspector, and second database 62 stores the printing condition, the printing parameter, and the reliability (in this case, the non-defective product rate) of the received printing parameter in association with each other.

In addition, first printing parameter acquisition device 100 may, for example, receive an inspection result (for example, good or bad quality of each of multiple board products) from printing inspector, and may create the reliability (in this case, the non-defective product rate) of the printing parameter based on the received inspection result. In this case, second database 62 stores the printing condition, the printing parameter, and the reliability (in this case, the non-defective product rate) of the created printing parameter in association with each other.

The above-described storage step of the data is performed when the printing parameter included in the production program is not changed. The storage step of the above-described data is performed on the printing parameter before the change and the reliability of the printing parameter before the change when at least a part of the printing parameters included in the production program is changed. As described above, second database 62 stores the printing condition, the changed printing parameter, and the reliability of the changed printing parameter in new association with each other when at least a part of the printing parameters included in the production program is changed.

1-4. Configuration Example of Second Printing Parameter Acquisition Device 200

Printer 1 may also include second printing parameter acquisition device 200. As illustrated in FIG. 2, second printing parameter acquisition device 200 includes an acquisition section 51 and output section 52, similarly to first printing parameter acquisition device 100. However, output section 52 of second printing parameter acquisition device 200 outputs the printing parameter associated with the printing condition corresponding to the printing condition acquired by acquisition section 51 and the reliability of the printing parameter from database 60. Database 60 stores the printing condition, the printing parameter used to control the driving of printer 1, and the reliability of the printing parameter in association with each other.

In addition, output section 52 of second printing parameter acquisition device 200 preferably outputs the printing parameter having the reliability of the predetermined level or more, similarly to that of first printing parameter acquisition device 100. Except for the point that output section 52 outputs the printing parameter and the reliability of the printing parameter from database 60, it is the same as first printing parameter acquisition device 100, and duplicate descriptions thereof will be omitted in the present description.

Output section 52 of second printing parameter acquisition device 200 can output the printing parameter and the reliability of the printing parameter, for example, by using the output screen illustrated in FIG. 5B. This drawing illustrates a state in which the reliability of the printing parameter is output together with the above-described printing parameter. The reliability of the printing parameter is represented by, for example, deviation DE1 such as production number NP1 of the board products, non-defective product rate GP1, and the area of solder 80 described above.

2. Others

Although first and second printing parameter acquisition devices 100 and 200 according to the embodiment are provided in control device 50 of printer 1, they may be provided outside printer 1. First and second printing parameter acquisition devices 100 and 200 may be provided, for example, in a management device that manages a board production line. First and second printing parameter acquisition devices 100 and 200 may be provided, for example, on a cloud.

In addition, printer 1 is not limited to the aspect using squeegee 34 and mask 70. Printer 1 may have an aspect in which solders 80 are sequentially coated to each of multiple printing positions of board 90 by using a printing head. In this case, the printing condition preferably specifies at least one of board 90 and solder 80. The printing parameter is preferably a control parameter when at least one of the printing speed and the printing pressure is controlled.

3. Printing Parameter Acquisition Method

The descriptions with respect to first and second printing parameter acquisition devices 100 and 200 can be similarly applied to a printing parameter acquiring method. Specifically, the printing parameter acquisition method includes an acquiring step and an outputting step. The acquiring step corresponds to control performed by acquisition section 51. The outputting step corresponds to the control performed by output section 52. The control performed by output section 52 may be control (first printing parameter acquisition method) performed by output section 52 of first printing parameter acquisition device 100, or may be control (second printing parameter acquisition method) performed by output section 52 of second printing parameter acquisition device 200.

4. Example of Effects of Embodiment

With first and second printing parameter acquisition devices 100 and 200, output section 52 outputs the printing parameter corresponding to the printing condition acquired by acquisition section 51 and being associated with the printing condition from database 60 in which the printing condition, the printing parameter, and the reliability of the printing parameter are stored in association with each other. Accordingly, first and second printing parameter acquisition devices 100 and 200 can easily manage the printing condition, the printing parameter, and the reliability of the printing parameter, and can easily output the printing parameter.

Output section 52 of first printing parameter acquisition device 100 outputs the printing parameter having the reliability of a predetermined level or more. Output section 52 of second printing parameter acquisition device 200 outputs the printing parameter and the reliability of the printing parameter. Accordingly, first and second printing parameter acquisition devices 100 and 200 can more preferably output the printing parameter used for controlling the driving of printer 1. The above description with respect to first and second printing parameter acquisition devices 100 and 200 can be similarly applied to the printing parameter acquisition method.

REFERENCE SIGNS LIST

1: printer, 34: squeegee, 51: acquisition section, 52: output section, 60: database, 61: first database, 62: second database, 70: mask, 80: solder, 90: board, 100, 200: printing parameter acquisition device

The invention claimed is:

1. A printing device comprising:
circuitry configured to:
acquire a printing condition for specifying a member to be used when solder is printed on a board;
output, from a database that stores a printing condition, a printing parameter used for controlling driving of a printer, and a reliability of the printing parameter in association with each other, the printing parameter which is associated with the stored printing condition corresponding to the acquired printing condition and of which the reliability is a predetermined level or more; and
drive the printer to print the solder on the board using the printing parameter,
wherein the circuitry is further configured to:
multiply a matching degree between the acquired printing condition and the stored printing condition by a coefficient representing weighting for each printing condition to determine a matching score that scores the matching degree between the acquired printing condition and the stored printing condition, and
determine that the higher the matching score, the more the acquired printing condition corresponds to the stored printing condition.

2. The printing device according to claim 1, wherein the database includes:
a first database provided by a manufacturer of the printer; and
a second database configured to store the printing condition, the printing parameter, and the reliability of the printing parameter in association with each other, which are used when a user of the printer manufactures a board product by using the printer.

3. The printing device according to claim 2, wherein when at least a part of the printing parameter included in a production program for driving the printer is changed, the circuitry is configured to store the printing condition, the changed part of the printing parameter, and a reliability of the changed part of the printing parameter in new association with each other in the second database.

4. The printing device according to claim 1, wherein circuitry is configured to receive a change of the coefficient by a user of the printer.

5. The printing device according to claim 1,
wherein the reliability of the printing parameter includes the matching score, and
wherein the circuitry is configured to output the printing parameter in descending order of the matching score.

6. The printing device according to claim 1,
wherein the reliability of the printing parameter includes a number of productions of board products produced by using the printing parameter, and
wherein the circuitry is configured to output the printing parameter in descending order of the number of productions.

7. The printing device according to claim 1,
wherein the reliability of the printing parameter includes a throughput from when loading of the board is initiated by the printer to when the solder is printed on the board to allow unloading of the board from the printer, and
wherein the circuitry is configured to output the printing parameter in descending order of the throughput.

8. The printing device according to claim 1,
wherein the reliability of the printing parameter includes a non-defective product rate which is a ratio of non-defective products when multiple board products are produced by using the printing parameter, and
wherein the circuitry is configured to output the printing parameter in descending order of the non-defective product rate.

9. The printing device according to claim 1,
wherein the reliability of the printing parameter includes a deviation with respect to a target value for each of an area of the solder printed on the board, a height of the solder printed on the board, and a volume of the solder printed on the board, and
wherein the circuitry is configured to output the printing parameter in ascending order of the deviation.

10. The printing device according to claim 1, wherein the printing condition specifies at least one of the board, the solder, a mask, and a squeegee as the member.

11. The printing device according to claim 1, wherein the printing parameter includes a control parameter for controlling at least one of a printing speed, a printing pressure, a mask release speed, a mask release distance, a cleaning interval and a cleaning method of a mask, and an angle of a squeegee at a time of printing.

12. A printing parameter acquisition device comprising:
circuitry configured to:
acquire a printing condition for specifying a member to be used when solder is printed on a board;
output, from a database that stores a printing condition, a printing parameter used for controlling driving of a printer, and a reliability of the printing parameter in association with each other, the printing parameter and the reliability of the printing parameter which are associated with the stored printing condition corresponding to the acquired printing condition; and
drive the printer to print the solder on the board using the printing parameter,
wherein the circuitry is further configured to:
multiply a matching degree between the acquired printing condition and the stored printing condition by a coefficient representing weighting for each printing condition to determine a matching score that scores the matching degree between the acquired printing condition and the stored printing condition, and
determine that the higher the matching score, the more the acquired printing condition corresponds to the stored printing condition.

13. A printing method comprising:
acquiring a printing condition for specifying a member to be used when solder is printed on a board;
outputting, from a database that stores a printing condition, a printing parameter used for controlling driving of a printer, and a reliability of the printing parameter in association with each other, the printing parameter which is associated with the stored printing condition corresponding to the acquired printing condition and of which the reliability is a predetermined level or more; and
driving the printer to print the solder on the board using the printing parameter, wherein the method further comprises:
multiplying a matching degree between the acquired printing condition and the stored printing condition by a coefficient representing weighting for each printing condition to determine a matching score that scores the matching degree between the acquired printing condition and the stored printing condition, and determining that the higher the matching score, the more the acquired printing condition corresponds to the stored printing condition.

14. A printing method comprising:
acquiring a printing condition for specifying a member to be used when solder is printed on a board;
outputting, from a database that stores a printing condition, a printing parameter used for controlling driving of a printer, and a reliability of the printing parameter in association with each other, the printing parameter and the reliability of the printing parameter which are associated with the stored printing condition corresponding to the acquired printing condition; and driving the printer to print the solder on the board using the printing parameter, wherein the method further comprises:
multiplying a matching degree between the acquired printing condition and the stored printing condition by a coefficient representing weighting for each printing condition to determine a matching score that scores the matching degree between the acquired printing condition and the stored printing condition, and determining that the higher the matching score, the more the acquired printing condition corresponds to the stored printing condition.

* * * * *